US009048937B2

(12) United States Patent
Suntken

(10) Patent No.: US 9,048,937 B2
(45) Date of Patent: Jun. 2, 2015

(54) METHOD FOR OPERATING A UWB DEVICE

(75) Inventor: Artur Wilhelm Suntken, Tiegerpoort (ZA)

(73) Assignee: ELMOS Semiconductor AG, Dortmund (DE)

( * ) Notice: Subject to any disclaimer, the term of this patent is extended or adjusted under 35 U.S.C. 154(b) by 0 days.

(21) Appl. No.: 14/235,351

(22) PCT Filed: Jul. 27, 2012

(86) PCT No.: PCT/EP2012/064795
§ 371 (c)(1),
(2), (4) Date: Jan. 27, 2014

(87) PCT Pub. No.: WO2013/014272
PCT Pub. Date: Jan. 31, 2013

(65) Prior Publication Data
US 2014/0204981 A1 Jul. 24, 2014

Related U.S. Application Data

(60) Provisional application No. 61/512,493, filed on Jul. 28, 2011.

(30) Foreign Application Priority Data

Jul. 28, 2011 (EP) ..................................... 11175705

(51) Int. Cl.
*H04B 1/00* (2006.01)
*H04B 1/707* (2011.01)
(Continued)

(52) U.S. Cl.
CPC ............... *H04B 1/707* (2013.01); *G01S 7/032* (2013.01); *G01S 7/282* (2013.01); *G01S 13/0209* (2013.01);
(Continued)

(58) Field of Classification Search
CPC . H04B 1/7174; H04B 1/7172; H04L 27/0004
USPC ........................................................ 375/140
See application file for complete search history.

(56) References Cited

U.S. PATENT DOCUMENTS 6,330,274 B1 12/2001 Uehara
2004/0174928 A1 9/2004 Siwiak
2006/0098713 A1* 5/2006 Tian .............................. 375/130

FOREIGN PATENT DOCUMENTS

WO 01/28310 4/2001
WO 01/93441 12/2001
WO 01/93482 12/2001

OTHER PUBLICATIONS

International Search Report for corresponding patent application No. PCT/EP2012/064795 dated Nov. 26, 2012.

*Primary Examiner* — Shuwang Liu
*Assistant Examiner* — David S Huang
(74) *Attorney, Agent, or Firm* — Renner, Otto, Boisselle & Sklar, LLP

(57) ABSTRACT

The method for operating a UWB device having at least one transmitting antenna and/or at least one receiving antenna comprises the following steps: controlling the transmitting antenna (12) or the receiving antenna (12') with a control pulse signal (13,13') having a sequence of substantially sinusoidal pulses of alternating polarity and differing amplitudes and particularly having the waveform of a fifth-order Gaussian pulse signal, wherein the transmitting antenna (12) can be alternately supplied with current pulses of differing polarity and differing magnitude by switching on and off first electronic switch units (16) that are coupled to the transmitting antenna (12) and have resistances associated with the amplitudes of the pulses to be generated, wherein each first switch unit (16) has a specifiable, particularly equal, number of first switching transistors (18,19), each having substantially identical on-state resistance values (R), wherein the resistance of a first switch unit is adjusted either by using only one of the first switching transistors (18,19) or by using a plurality of first switching transistors (18,19) connected in parallel, and wherein the first switch units (16) are controlled sequentially according to a specifiable temporal schema and each for a control time interval of a predetermined length.

12 Claims, 11 Drawing Sheets

Figure 1:
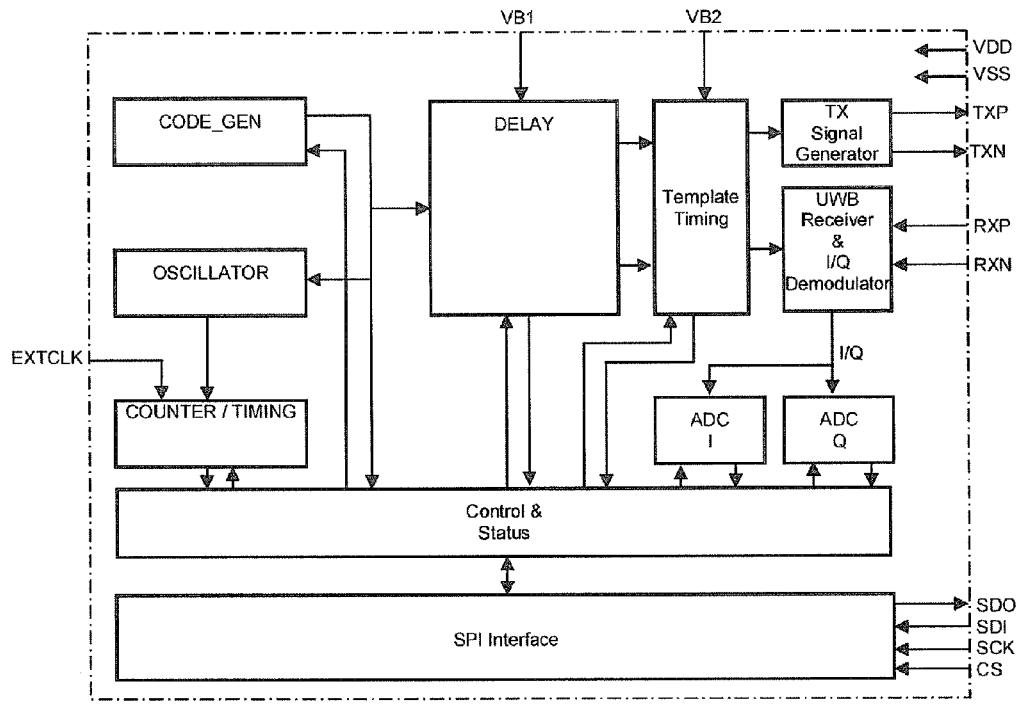

(51) Int. Cl.
*G01S 7/03* (2006.01)
*G01S 7/282* (2006.01)
*G01S 13/02* (2006.01)
*G01S 13/28* (2006.01)
*H04L 27/00* (2006.01)
*H03B 28/00* (2006.01)
*H03K 5/1534* (2006.01)
*G01S 7/288* (2006.01)
*H04B 1/717* (2011.01)

(52) U.S. Cl.
CPC ........... *G01S 13/284* (2013.01); *H04L 27/0004* (2013.01); *G01S 2007/2886* (2013.01); *H03D 2200/0019* (2013.01); *H04B 1/7172* (2013.01); *H04B 1/7174* (2013.01); *H03B 28/00* (2013.01); *H03K 5/1534* (2013.01)

Signal generator / transmitter combination

Receiver / Gilbert multiplier combination

Transmit and Template waveform generation for 0 and 90° out of phase signal

METHOD FOR OPERATING A UWB DEVICE

This application is a national phase of International Application No. PCT/EP2012/064795 filed Jul. 27, 2012 and claims priority to European Patent Application No. 11175705.0 filed Jul. 28, 2011 and U.S. Patent Application No. 61/512,493 filed Jul. 28, 2011.

INTRODUCTION

The invention relates to a method for operating a UWB (ultra wide band) device as a radar or for communication purposes.

STATE OF THE ART

There exist radar systems which are based on transmission of individual pulses and on pulse shaping. Further, it is common practice to perform the modulation and demodulation by use of e.g. analog multipliers.

Known from WO-A-01/93441 is a UWB transmitting and respectively receiving unit designed for UWB spread spectrum and provided for communication. In this known device, logical "ones" and logical "zeros" are generated, each of them being generated by a respective sequence of a plurality of pulses with alternating signs and respectively alternating polarity, wherein the order in which the pulses follow each other is different for making it possible to differentiate between a logical one and a logical zero. Herein, use is made of amplifier circuits and summing units, which is relatively complex.

From US-A-2004/0174928, there is known a method and a device for the transmitting and receiving of spread spectrum signals having continuous wave shapes. In this device, the signals will be generated by individual pulses which are weighted differently.

A method and a device similar to US-A-2004/0174928 are known from WO-A-01/93482.

WO-A-01/28310 describes an adaptive high-frequency transceiver.

Known from US-B-6/330,274 is a spread spectrum correlator with Gilbert multipliers.

OBJECT OF THE INVENTION

It is an object of the invention to provide a control for an ultra wide band (UWB) device that is capable of low-energy (particularly for applications with self-contained energy supply) and nonetheless simple and reliable transmit signal generation and/or receive signal processing.

INVENTION

To achieve the above object, there is provided, in accordance with the invention, a method for operating a UWB device having at least one transmitting antenna and/or at least one receiving antenna, said method comprising the following steps:

controlling the transmitting antenna or the receiving antenna with a controlling pulse signal having a sequence of substantially sinusoidal pulses of alternating polarity and differing amplitudes and particularly having the waveform of a fifth-order Gaussian pulse signal, wherein the transmitting antenna can be alternately supplied with current pulses of differing polarity and differing magnitude by switching on and off first electronic switch units that are coupled to the transmitting antenna and have resistances associated with the amplitudes of the pulses to be generated, wherein each first switch unit has a specifiable, particularly equal, number of first switching transistors, each having substantially identical on-state resistance values, wherein the resistance of a first switch unit is adjusted either by using only one of the first switching transistors or by using a plurality of first switching transistors which are connected in parallel, and wherein the first switch units are controlled sequentially according to a specifiable temporal schema and each for a control time interval of a predetermined length.

According to the invention, the transmit pulse of the UWB device is generated by a combination of individual pulses of different polarities and different amplitudes. For this purpose, use is made of current sources which are realized in the form of resistors. The specific character of the invention resides in that the differently sized resistors by which pulses of different levels can be generated, are realized by parallel arrangement of a number of electronic switches (switch transistors) effecting the total resistance value of the respective resistor.

By the concept, as provided by the invention, of transmit pulse generation by individual pulses generated in a temporally controlled manner, the UWB device of the invention will require merely little energy, which is of advantage particularly for applications with self-contained operation. The UWB device of the invention can be used both as a UWB radar and as a UWB communication device. While the UWB radar serves for detection of bodies, objects and the like within a detection area, the UWB communication device is used for the purpose of communication by transmission of (modulated) transmit pulses by a transmitting antenna, which pulses will then be received by a receiving antenna.

According to an advantageous embodiment of the invention, it is provided that the control time intervals of two switch units being controlled temporally successively are mutually overlapping or are temporally spaced.

For improving the detection properties of the UWB device when applied as a UWB radar, it is suitable if the pulse signal comprises two substantially identical sequences, phase-shifted by 90°, of substantially identical sinusoidal pulses.

For correlation of a receive signal received by the receiving antenna with the transmit signal, a correlation signal will be generated, notably in the same manner as the transmit signal and by use of second switch units similar to the first switch units, said second switch units being sequentially controlled according to the temporal schema in the same manner as the first switch units.

Further, it can be suitable if the receiving antenna is connected with at least one Gilbert multiplier comprising a respective differential stage consisting of a pair of transistors, wherein the differential stage of the Gilbert multiplier has second switch units connected to it which can be switched on and off and via which a pulse signal is supplied to the Gilbert multiplier that is substantially similar to the control pulse signal for the transmitting antenna, wherein each second switch unit comprises a specifiable, particularly identical number of second switch transistors each having substantially the same resistance value, wherein the resistance of a second switch unit is set either by use of only one of the second switch transistors or by use of a plurality of second switch transistors which are connected in parallel, and wherein the second switch units are controlled according to substantially the same temporal schema as the first switch units in a sequential manner and with predetermined length for the control time interval.

Preferably, the receiving antenna is coupled to a second Gilbert multiplier, one of the two Gilbert multipliers being supplied with a pulse signal substantially identical with the control pulse signal for the transmitting antenna and the other one of the two Gilbert multipliers being supplied with a pulse signal shifted in phase by 90° relative to said pulse signal.

According to a further advantageous embodiment of the invention, it is provided that all switch transistors have a respective switch-on resistance value, the deviation of the switch-on resistance values from a specifiable reference value being maximally 10%, preferably maximally 5%. Manufacture of such switch transistors of the same type can be realized in that the switch transistors are formed in a sole semiconductor device or in different semiconductor devices which, however, have been produced on a sole wafer, or in different semiconductor devices on different wafers which, however, have been produced in a common batch.

Thus, in a general way, the invention pertains to a method for wireless transmission of a signal via a transmission channel between a transmitter and a receiver, particularly with arrangement of a reflective or transmissive object between the transmitter and the receiver, under application of a spread spectrum modulation and demodulation method with spreading code signals, wherein the spreading code signal is generated by addition of a number n of temporally successive, amplitude-weighted pulses having a pulse width T and different signs, the pulses being respectively delayed relative to each other by a rational portion i/k of the pulse width T, with i and k each being integers. Particularly, the transmit pulse generated in this manner and respectively the spreading code signal generated in this manner has the shape of a Gaussian pulse of the 5th order. Such a transmit pulse is very robust and will hardly change its shape even upon multiple reflection. Thus, such a transmit pulse is suitable particularly when the UWB device of the invention is applied as a radar.

Further, it is suitable if the shape of the pulses is variable in width and amplitude. These pulses substantially have the shape of sine half-wave-shaped signals which are weighted and temporally delayed and have different signs. Herein, the derivation of the pulse duration is suitably performed without oscillator.

According to a further advantageous embodiment of the invention, it is provided that the pulses are weighted in a circuit network comprising mutually parallel series circuits, each of said series circuits having a switch and a weighted resistance and/or a weighted current source. Further, it is advantageous if the spreading code signal is used both on the transmitter side as a transmit signal and on the receiver side for a correlation with the received signal. Herein, it is advantageously possible to use the same circuit or identical circuits for the transmitter-side and the receiver-side generation of the spreading code signal.

According to a further advantageous embodiment of method of the invention, it is provided that, on the receiver side, use is made of at least one Gilbert multiplier having at least one analog and at least one digital input, or a Gilbert multiplier in which at least one pair of differential stage transistors is connected to at least one weighted, controllable resistance or to weighted, controllable current sources, or at least one Gilbert multiplier in which the spreading code signal is generated by use of a circuit network comprising mutually parallel series circuits, each of said series circuits having a switch and a weighted resistance and/or a weighted current source.

It is suitable if the pulses are transmitted in burst groups comprising respectively n pulses, with n>1 and n being an integer, and if each pulse in such a burst group is mapped onto another pulse of this burst group through a temporal offset by a factor $m*T/n$, with T being the pulse duration and $m<(n+1)$ and being an integer, and by an amplitude multiplication by a rational number a. Herein, for instance, n is an integer and larger than or equal to 4, wherein, for generating the spreading code signal, each positive pulse is followed by a negative pulse and vice versa, and a respective multiplier is provided for each pair of positive and negative pulses.

For instance, at least one or a plurality or all of the pulses used for generating the spreading code signal are obtained from the detection of the passage of a base signal through a switching threshold. As a switching threshold, there can be selected to be a rising or falling flank of a digital control signal, and the respective flank of the control signal can be identified by flank detection.

According to a further embodiment of the invention, further pulses for use in generating the spreading code signal are generated from at least one first pulse through delay of this first pulse by a rational fraction l/j, with l and j each being integers, of the pulse width T of this pulse.

The invention makes it possible, on the one hand, to implement, in standard digital technology, a UWB transmitter in the frequency range from 3 GHz to 5 GHz in fulfillment of the regulations for spectral power density and with low current consumption and, on the other hand, to implement, in standard digital technology, a UWB receiver with low current consumption in the evaluation of echo signals far below background noise.

For the transmit signal generation according to the invention, there applies:

Signal generation for the transmit burst with the aid of a delay line and weighted switches.

Thereby, there is achieved a very good approximation to the ideal signal shape (frequency spectrum).

The concept will cause current consumption only during the pulse duration.

There exist no initial and final oscillation processes.

No use is made of special component parts such as e.g. coils.

According to the invention, the following applies for the reception and the demodulation:

Template generation for the Gilbert multiplier with the aid of a delay line and weighted switches.

Use is made of only one delay line which will drive the transmit signal generator and the template generators in the receiver.

The switches per se are components of the multiplier—the detour via an analog template signal is avoided. The developed Gilbert multiplier is, in principle, a multiplier which will multiply the analog signal from the antenna by a digital signal (weighted switches).

Supply power is required only during the pulse duration.

The demodulated signal (DC average value) will be processed, via a sample circuit and an integrator, for the DA converter which is allowed to be relatively slow.

By the use of two demodulators (multipliers) and two templates (0 and 90 degrees), the amount of the reflected signal can always be detected, thus avoiding a "scanning" in steps of <80 psec which would result in a multiple of time consumption in the movement detection.

Figure 2:
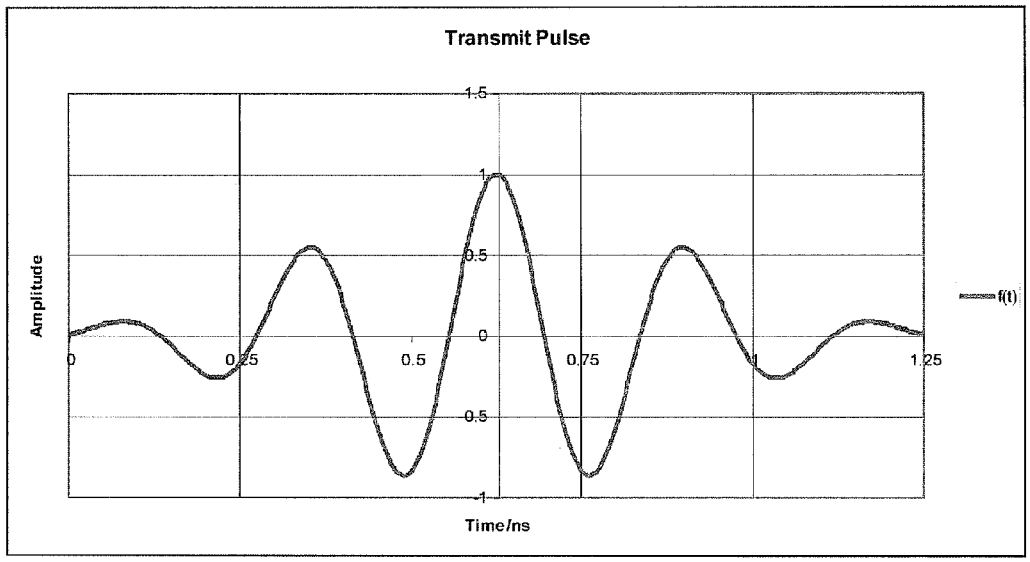
Figure 3:
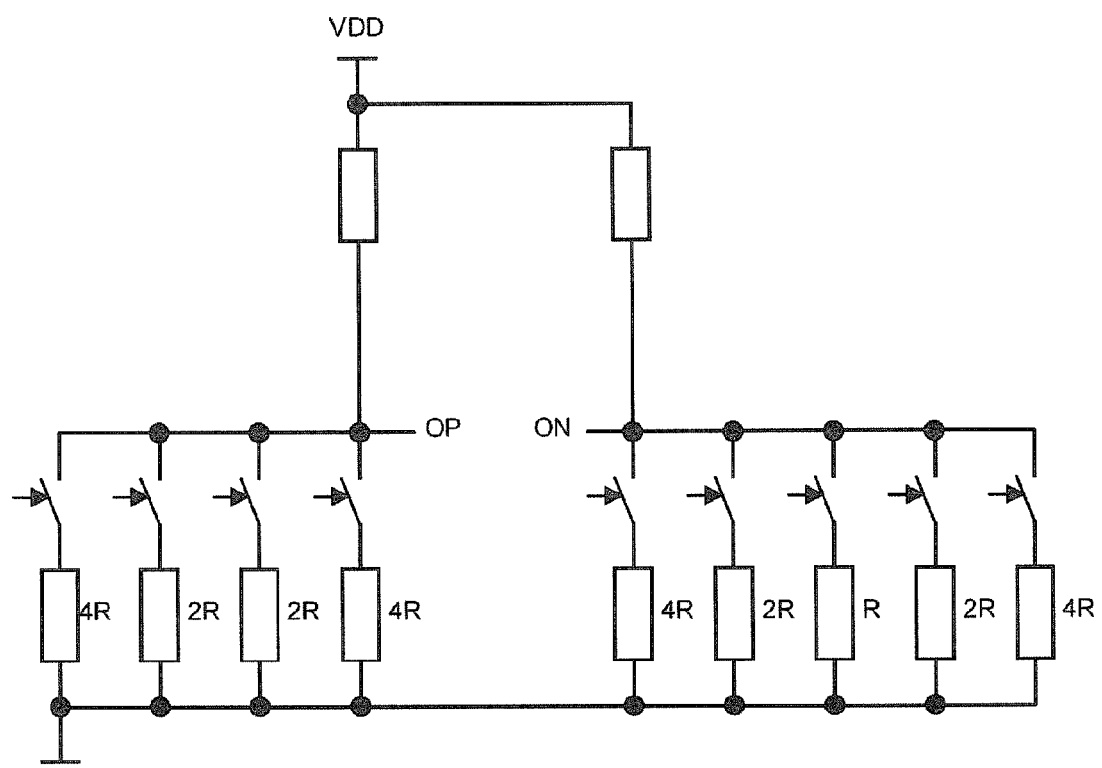
Figure 4:
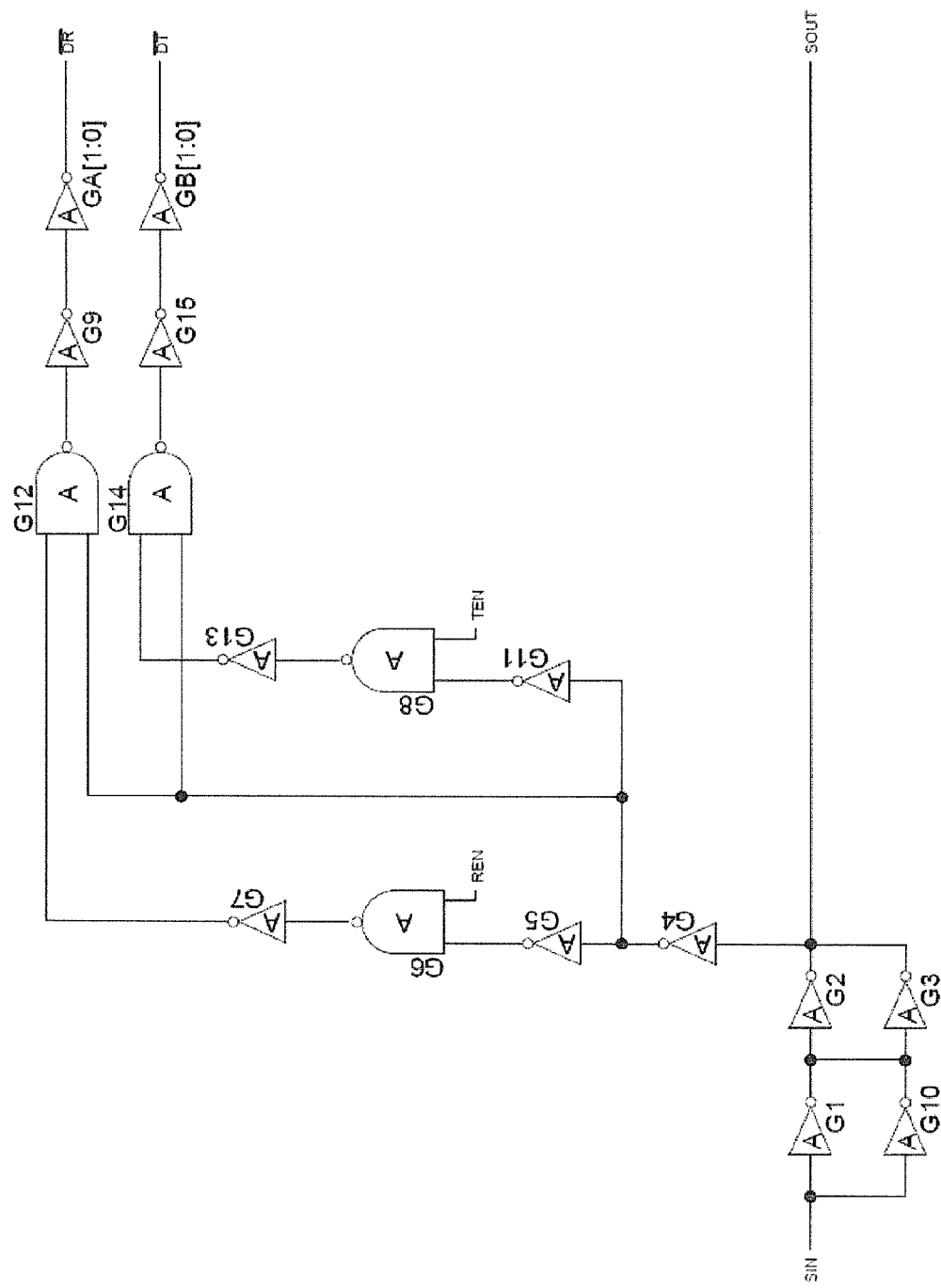
Figure 5:
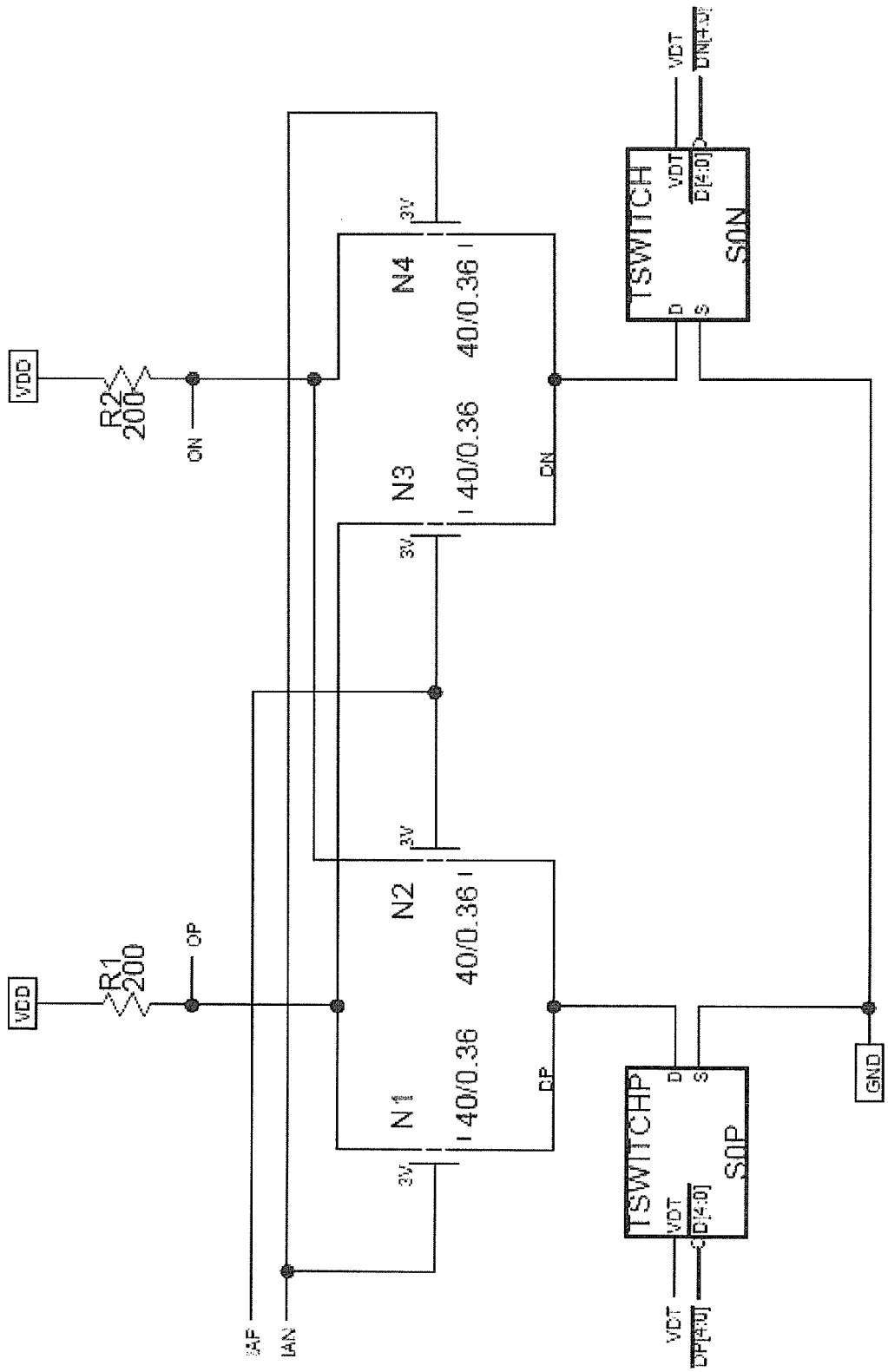
Figure 6:
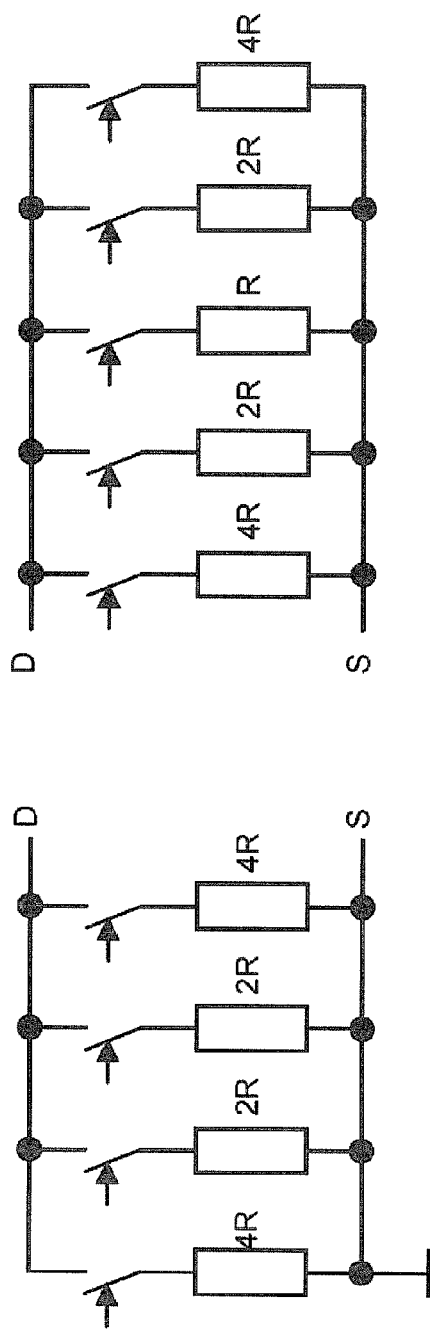
Figure 7:
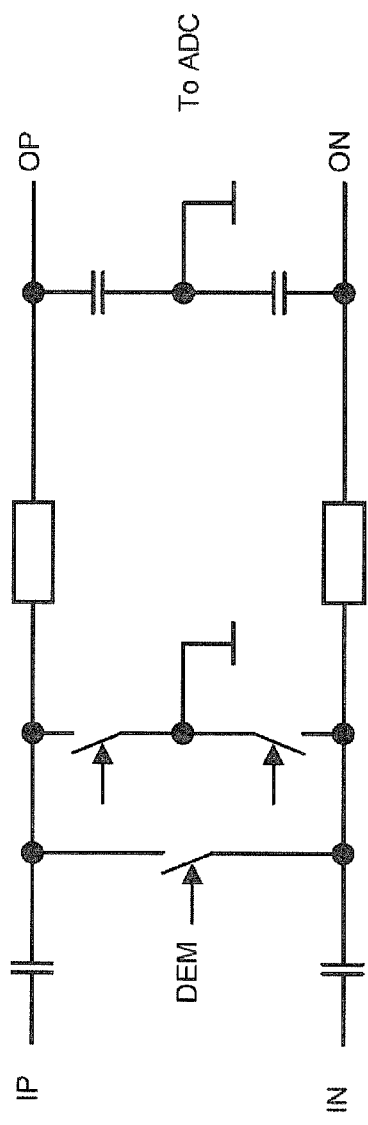
Figure 8:
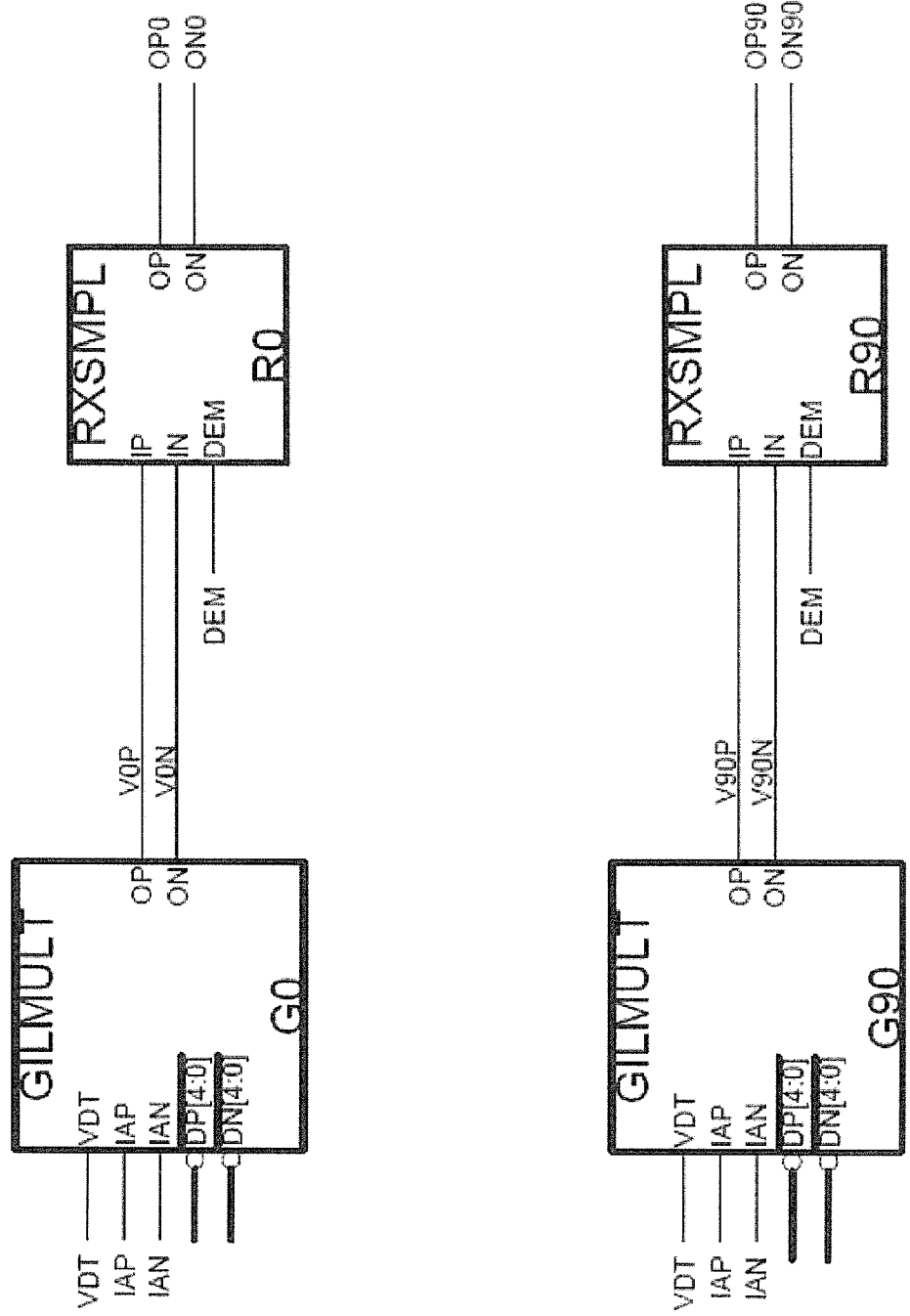
Figure 9:
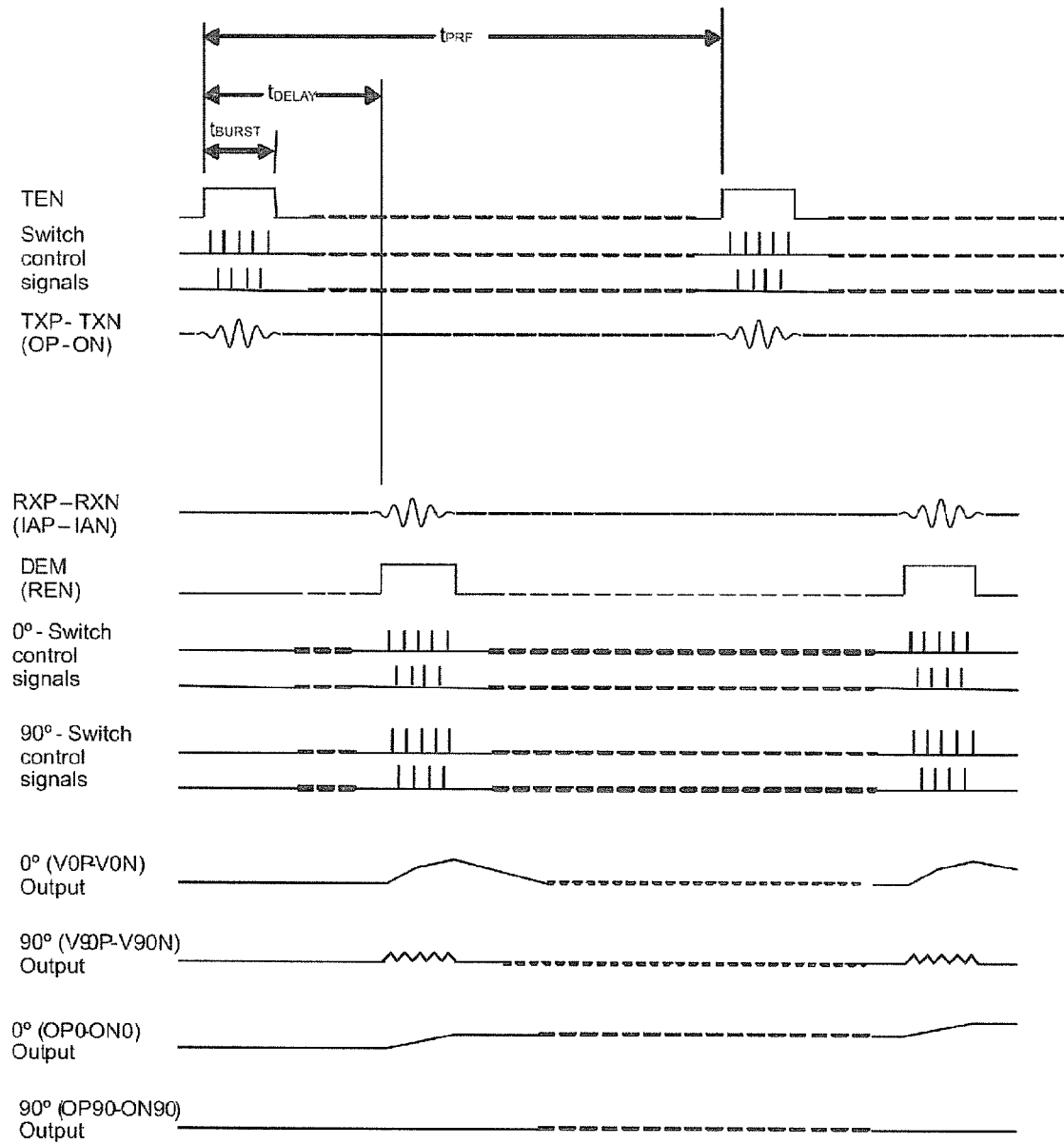
Figure 10:
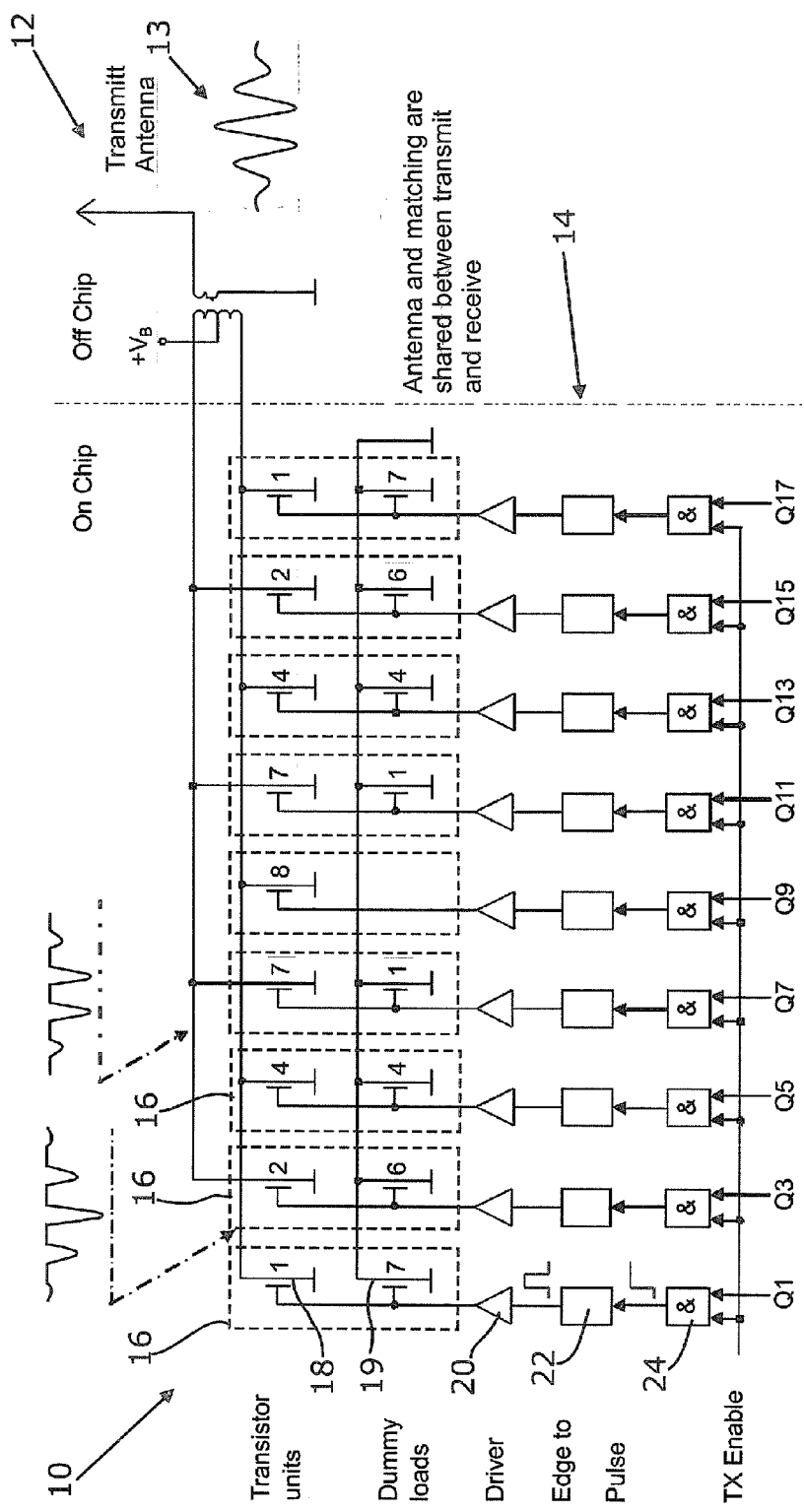
Figure 11:
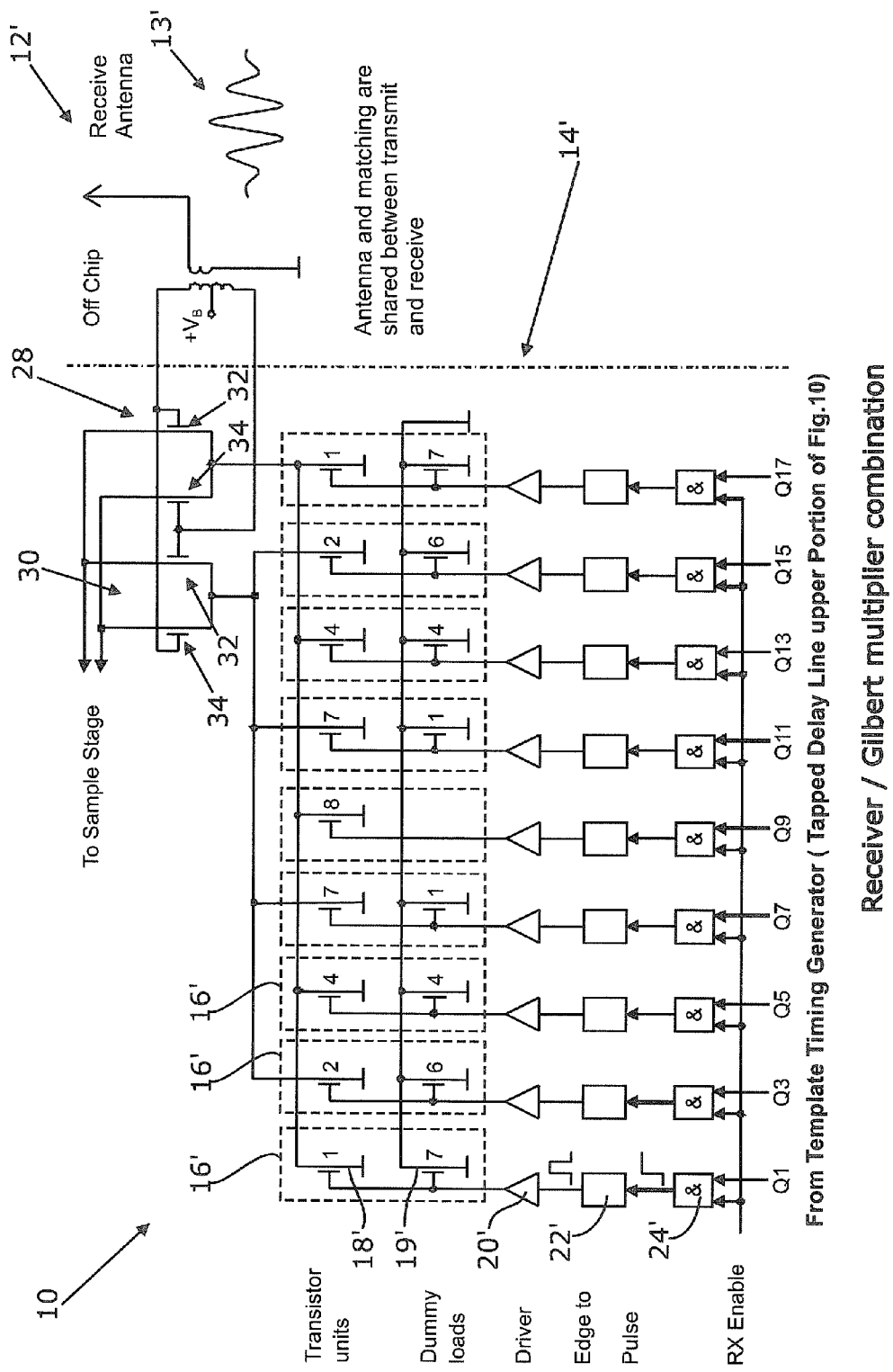
Figure 12:
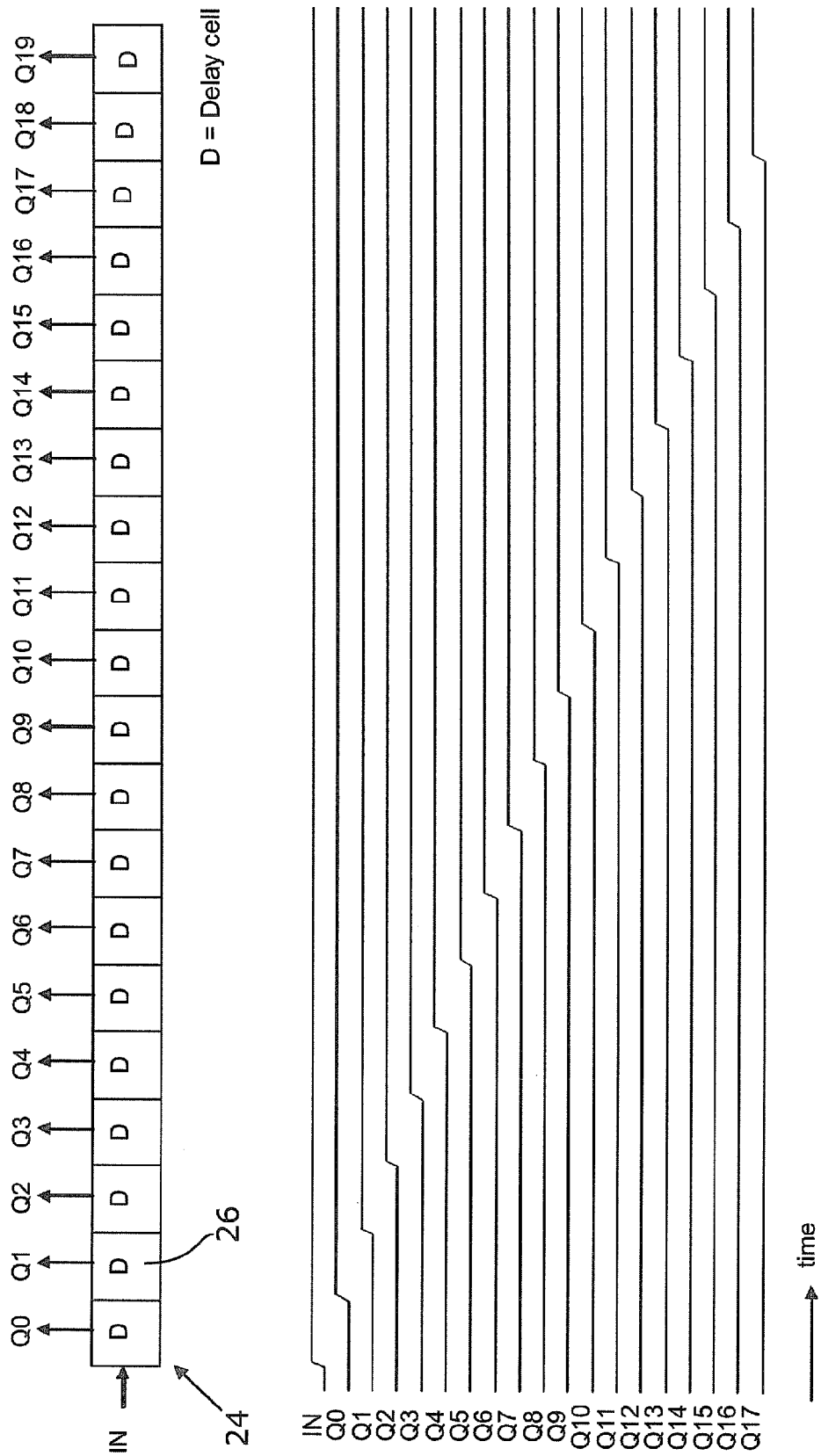
Figure 13:
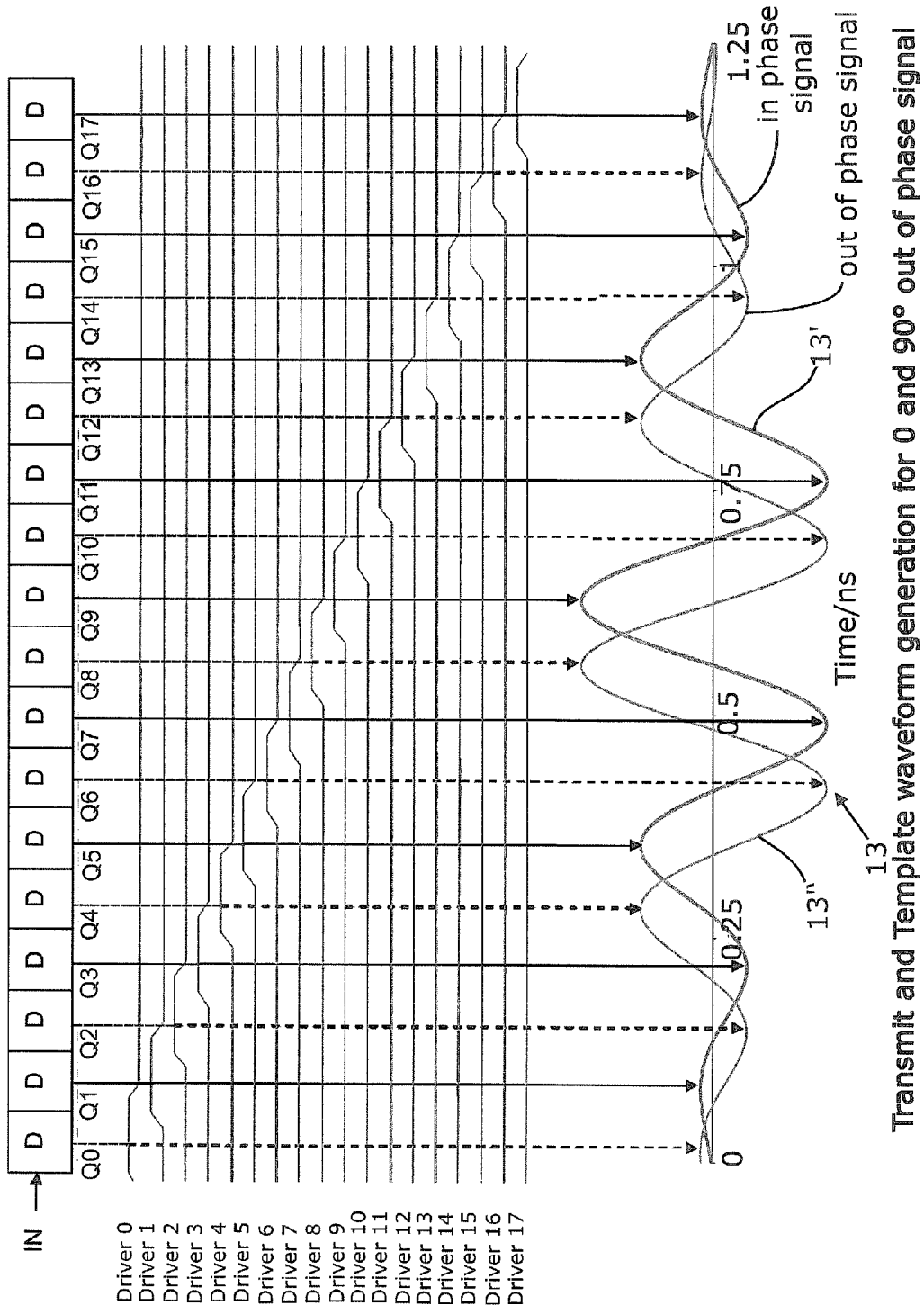

The invention will be explained in greater detail hereunder by way of two embodiments and with reference to the drawing. In the Figures of the drawings, the following is shown:

FIG. 1 shows a block diagram of an exemplary system,

FIG. 2 shows an exemplary wavelet template comprising a plurality of weighted pulses, FIG. 3 shows a transmission generator as network of weighted switches to be actuated in a temporally reduced manner, FIG. 4 shows a control pulse generator stage, FIG. 5 shows a Gilbert multiplier, FIG. 6 shows a switchable weighted current source, FIG. 7 shows a sample and hold circuit with integrator, FIG. 8 shows an interconnected arrangement of a sample and hold circuit with integrator and a Gilbert multiplier, and FIG. 9 shows a timing diagram, FIG. 10 shows a block diagram of the circuitry related to the transmitting antenna of a UWB transceiver architecture according to a second embodiment of the invention, FIG. 11 shows a block diagram of the circuitry related to the receiving antenna of a UWB transceiver architecture according to the second embodiment, FIG. 12 shows a schematic representation of the shift register for realizing the control template for the transmitting and receiving antennas and the timing diagram for the temporally offset generation of control signals for the switch units of the circuitry according to FIGS. 10 and 11, and FIG. 13 shows the time signals for the controlling of the drivers of the circuitry according to FIGS. 10 and 11 for generating two Gaussian pulses of the 5th order shifted in phase by 90°.

Illustrated in FIG. 1 is an exemplary evaluation circuit in which the device of the invention is applied.

The evaluation circuit comprises an SPI interface, as known to the expert, with the usual signals SDO, SDI, SCK and CS.

Via said interface, there is addressed and controlled a control and status logic which, on the one hand, allows for the parameterization of the evaluation circuit but can also pass on the measurement values via said SPI interface to a data processing system, not shown here.

The digital system comprises an oscillator of a relatively low frequency, whose frequency does not correspond to the center frequency of the ultra wide band signal but is considerably lower. Thereby, the current consumption of the circuit is noticeably reduced. This is rendered possible by the basic thought of the invention—explained in the further course of the description—which allows for omission of an oscillator for generating the transmission frequency.

A counter/timer and further memory nodes in the control and status logic will control the development of the transmitting and receiving process.

An essential component of the evaluation circuit is the code generator which will generate a bit sequence to be passed on, by the control and status logic, to the transmitting and receiving unit.

The transmit signal will leave the evaluation circuit via the bipolar connectors TXP and TXN. The reception signal will reach the circuit via the connectors RXP and RXN. From there, it will enter the UWB receiver and demodulator.

From there, the (still two-phased) signal will pass on to a two-phase ADC (ADC I and ADC Q).

Further, the evaluation circuit comprises a first delay line for the code signal (delay) and for defining the timing for the code generated by the code generator, by use of a predetermined template.

In case of code flanks, the TX signal generator will now generate pulses of defined shape. The shape of the pulses and thus their spectrum are defined by the circuit. This means that the center frequency of the pulse spectrum will not be determined by an oscillator which, on the one hand, would not have the required precision and, on the other hand, would require a considerable amount of electric energy.

FIG. 2 shows a typical burst which is composed of individual pulses of different heights and temporal position. The burst has the shape of a sine and respectively cosine function multiplied by a Gaussian distribution. Thus, it is similar to the burst of an Si function $(\sin(x)/x)$.

These pulses are now used as wavelets to generate thereby the desired modulated transmit signal. The individual pulses are generated with a temporal delay and are added in a weighted state so that the burst function is realized. This makes it possible to map a frequency range particularly in the single-digit or double-digit GHz range, e.g. from 1 GHz to 10 GHz or, more precisely, 3 GHz to 5 GHz.

The bit stream defined by the code generator, which typically is a pseudorandom bit stream, defines by its flanks the temporal position of the pulses.

By dynamic variation of the circuit configuration, the pulse shape can be varied in width and height for different flanks.

For being able to transmit orthogonal bursts, one can use pulses shifted by $\pi/2$, i.e. shifted e.g. by half a pulse width, which are generated by a second parallel modulation line. For this purpose, the digital signal of the code generator will be delayed by said $\pi/2$ in a second delay line (not shown because familiar the expert). This method can also be applied on the reception side.

An exemplary signal generator, here of the bi-polar type, is shown in FIG. 3. The switches can be designed e.g. as transistors. By brief closure of the switches, there is generated a respective current pulse, depending on the respective resistance, which can be picked up at ON and respectively OP for transmission. For each peak of the template pulse (FIG. 2), a switch will be closed.

The control pulses in this case come from a short delay chain (FIG. 4). The delay line herein is calibrated by the supply voltage VB1 of the block DELAY (see FIG. 1). This voltage determines e.g. the center frequency of the pulse spectrum. For guaranteeing a congruence of the spectral properties, the same delay chain will be used both for the transmit signal generation and for the template generation for demodulation.

FIG. 4 shows an exemplary digital control pulse generator stage corresponding to the state of the art, which, from the signal of the code generator that is fed into the circuit at SIN, or from a preceding control pulse generator stage, will generate two bipolar pulse signals which, at DR and DT, will leave the control pulse generator stage again in the form of a respective bipolar signal. The digital signal at SIN will, after a delay, leave the circuit again at SOUT and from there can be fed again into a following control pulse generator stage. By linking a plurality (e.g. 20) of stages of this kind, there will be generated a plurality of pulsed control signals DR[0 . . . n] and DT[0 . . . n], identically delayed relative to each other, each of them additionally being bipolar.

Herein, the signals TEN and REN allow for the change between transmission and reception.

The gates G1, G2, G10 and G3 will delay the signal in each stage.

The gates G4, G5 and G11 serve for decoupling of the transmit and receive pulses of this delay stage.

The gates G6 and G8 serve as an entrance for switch-on of the transmission and reception operation.

G7, G12, G9 and the gate GA provided with a bipolar output will drive the bipolar signal DR in reception operation.

Herein, the buffer circuit for the following switches will safeguard the shape of the pulses and thus the spectrum. At the same time, the temporal positioning of the pulses (timing) relative to each other in accordance with the switches that have to be controlled must be maintained.

FIG. 5 shows a Gilbert multiplier on the receiver side, as advantageously used according to the invention.

On the receiver side, said multiplier is typically used twice (FIG. 8). This GilBert multiplier comprises two differential amplifier stages having respectively two transistor pairs N1, N2 and N3, N4. Each of these pairs is provided with a digitally controlled current source (TSWITCHP). These are shown in an exemplary manner in FIG. 6. In the context of the present application, the signal VDT does not play a role. The pulses generated by the control pulse generator (FIG. 4), being temporally displaced relative to each other, will be connected to a respective controllable current source via bus DP and DN.

The signals of bus DP herein are a subset of the signals supplied by said linked array of the control pulse generator stages. The same holds true for the bus DN.

These signals will now adjust the weighted and controlled current sources in such a manner that, within a Gilbert multiplier (FIG. 4), the current pulse of one current source will be have been displaced relative to the current pulse of the other current source by $\pi$. Herein, the shape of the resultant current pulses input into the differential amplifier stage again corresponds e.g. to the one shown in FIG. 2.

In order to guarantee this, the delay of the control pulse generator stages by the gates G1, G2, G10 and G3 is selected to correspond to a respective delay by $\pi/2$.

This means that the pulse shape and the delay are not selected independently from each other. Instead, the expert, by way of simulation and computation, will be able to safeguard that, in the desired operating range of the system, the pulse shape and the delay will largely fulfill the above requirement.

In this manner, by the delay of the control pulse generators in combination with the timing template—which, from this choice of delays, will select some and connect them with the weighted current sources (see FIG. 6)—there is made available a basic pattern of orthogonal wavelets without requiring, for this purpose, a local oscillator of the carrier frequency.

If now, for instance, the output terminals of the control pulse generator are provided with a serial numbering in correspondence with the obtained delay, the description hereabove is to say that the conduits of the bus DP of the first Gilbert multiplier are connected to the even-numbered delay elements (control pulse generator stage output terminals) while the corresponding conduits of its bus DN are connected to the output terminals increased by two. For the second Gilbert multiplier, this means that the conduits of its bus DP are connected to odd-numbered delay elements (control pulse generator stage output terminals) increased by one relative to the even-numbered output terminals while the corresponding conduits of its bus DN are connected to the likewise odd-numbered output terminals increased by two.

Thus, as an output signal of the two Gilbert mixers, respectively two signals ON and OP are obtained which represent the templates—supplied with a delay of 0, $\pi/2$, $\pi$ and $3/2\pi$—in the antenna signal which is supplied respectively to IAP and IAN.

Now, in order to be able to filter out exclusively a specific reflection, ON and OP of each pair will be stored in a respective sample and hold circuit (FIG. 7). For this purpose, the three switches will be closed by means of the control logic. The input capacitors will be loaded. When the switches are opened, their contents will be transferred to the two output capacitors.

FIG. 8 shows the interconnection of a respective sample and hold circuit with a respective Gilbert multiplier.

One of the pairs of ON and OP forms the bipolar signal I, and the other pair forms the bipolar signal Q.

These low-frequency signals can now be converted into a respective digital status word by a respective analog/digital converter (ADC) and can be read (see FIG. 1).

FIG. 9 again shows the timing used. During the burst duration $t_{Burst}$, the enable signal TEN for the transmission process will become active (high). During this time, by means of the weighted switches of the transmission generator (FIG. 3), there will be generated pulses on ON and OP, whereby the bipolar signal formed by ON and OP will present TXP-TXN (OP-ON) bursts, as shown in FIG. 2. The five pulses which in this timing diagram according to FIG. 9 are shown, in the first diagram, below the interval $t_{BURST}$, will determine the five positive sine half waves, while the four pulses shown below these five pulses in a "staggered" arrangement to these will determine and form the negative sine half waves of the burst signal according to FIG. 2.

Between two bursts, a time $t_{PRF}$ will pass which can have a random length.

After the start of the transmission pulse, the reflected (and normally massively disturbed) pulse will arrive again at the receiving antenna. This antenna will supply the signal RXP-RXN (IAP-IAN). By means of a systematic search, the delay between $t_{DELAY}$ between the start of the transmission pulse and the beginning of the receiving phase can now be set in such a manner that the enable signal for the receiver DEM (REN) will become active with the arrival of the pulse.

Now, in contrast to the transmission case, four pulse families will be generated. Two of them correspond to those of the transmitter. The two others also correspond to those but are phase-shifted by 90° relative to the first two pulse families. By these signals, said two Gilbert multipliers are controlled which supply the signals 0° (VOP-V0n) and 90° (V90P-V90N). These signals will be scanned by said two sample and hold circuits. The latter will supply the signals 0° (OP0-ON0) and 90° (OP90-ON90).

The diagram shows how, by integration, the value of 0° (OP0-ON0) will increase. Due to the phase relationship of the input signal RXP-RXN(IAP-IAN), the level of 90° (OP90-ON90) will not change.

Advantages of the Invention Over the State of the Art

In the state of the art, the lower signals of the Gilbert multipliers (FIG. 5) are used for the supply of the antenna signal. By the inventive use of the lower stage for a current pulse wavelet generator and the infeed of the antenna signal into the upper multiplier stage, the circuit can be fully realized by use of NMOS transistors, resulting in a gain of space and speed.

The Gilbert multiplier for demodulation of the spread spectrum signal is characterized in that it consists of two Gilbert multipliers which, each for itself, will demodulate the input signal with the aid of an orthogonal template, with the template being implemented through the transistor sizes in the current source (FIG. 6).

It is of particular advantage that no local oscillator is necessitated for the pulse center frequency because the pulse shape will be defined by the circuit. The pulse shape in terms of width and height will be defined by the circuit.

Since the template is generated identically for the transmission and reception branches, the pulse shapes for the transmission and reception templates coincide. Thus, also the spectra coincide.

A further advantage is to be seen in that the UWB radar makes it possible to detect bodies in space with the aid of reflected signals and to obtain the reflected signal from a heavily disturbed signal flow.

By suitable layout measures, it can be safeguarded that the current sources and respectively the switch resistances in the transmission and reception branches will match with each other.

Transmit Waveform Generation for Ultra Wide Band Radar (FIG. 10)

For this embodiment, there was selected a Gaussian pulse-like waveform of the 5th order according to FIGS. 2 and 14, respectively. The signal can be subjected to a large variety of derivative processes (transmission, reflection, reception) without losing its correlation properties. In practical applications, the case may occur that a waveform will undergo up to five derivative processes before reaching the receiving antenna.

For transmission, the waveform offers the required spectrum without additional filtration (Provision 9/2010, General Assignment of Frequencies for Use by Low-Energy Ultra Wide Band Applications).

The transmit signal is generated by weighted switches which are controlled by partially overlapping signals.

In the transmitter, power is consumed only during generation and transmission of the signal.

The number mentioned near a switch indicates how many units—e.g. comprising eight transistors—are connected in parallel. In this example, the $R_{SDON}$ of a transistor is SR. In the manner "8" stands for R, a "1" stands for 8*R.

For driver load matching, unused NMOS transistors will be connected to GND (referred to as a "dummy load").

Receiver with Correlator/Demodulator for Ultra Wide Band Radar (FIG. 11)

The receiver consists of a Gilbert multiplier. The receive signal will be applied to the upper transistors of the multiplier circuit so that the same pins can be used together with the transmitter output. The DC bias voltage and the match requirements are the same. The lower area includes the same type of weighted switches, controlled by partially overlapping signals, as the transmitter.

For computing the amount of the receive signal, two identical Gilbert multipliers are required. One of the circuits is controlled by the in-phase pulses (Q1, Q3, Q5, Q7, Q9, Q11, Q13, Q15, Q17), and the other circuit is controlled by signal shifted in phase by 90° (Q1, Q2, Q4, Q6, Q8, Q10, Q12, Q14, Q16).

In the transmitter, power is consumed only during generation and transmission of the signal. The receiver/Gilbert multiplier ignores each signal (inclusive of the transmit signals) which does not occur in the correlation (time) window.

The number mentioned near an NMOS transistor (switch) indicates how many units are connected in parallel. In the manner "8" stands for R, a "1" stands for 8*R.

For driver load matching, unused NMOS transistors will be connected to GND (referred to as a "dummy load").

Template Timing Generator

Reference is made to FIG. 12.

The timing template generator is required for generating a sequence of flanks for the flank-to-pulse converters. There is used a tapped delay line. The propagation speed will determine the center frequency of the transmission/template spectrum and can be calibrated by DC bias voltage. The delay cells having the outputs Q18 and Q19 are dummies for matching purposes.

A so-called "template timing generator" comprising the tapped delay line is used to generate the two template signals for the receiver. A pulse is generated from the flank of the signal propagating through the template timing generator (delay line). Matched drivers (0 . . . 17) will control the weighted switches in the transmission and reception circuit.

The receiver will emit two signals which are shifted in phase by exactly 90°. The center frequency is adjusted by means of the bias voltage for the template timing generator. Calibration is performed by switching the delay line into feedback loop and tuning the resulting oscillator frequency.

In order to guarantee an exact matching of the timing, use is made of the (physically) identical template timing generator for generating the timing both for the transmission and the reception template.

Template Timing Generator for an in-Phase Signal and for a Signal Shifted in Phase by 90°

Reference is made to FIG. 13.

The signal which is in-phase is generated e.g. by the odd-numbered output of the template timing generator. The signal which is shifted in phase by 90° is generated e.g. by the even-numbered output of the template timing generator.

According to the exemplary embodiment shown in FIGS. 10 to 13, the UWB device 10 which in this exemplary embodiment can be formed as a radar, comprises a transmitting antenna 12 operative for repetitive transmission, periodically or in another manner, of transmit pulses of the 5th Gaussian order. According to the invention, these pulses are generated without using an oscillator, with the resultant advantage of reduced energy requirement. In the exemplary embodiment shown in FIGS. 10 to 13, the transmit pulses are generated by temporally adjusted generation of individual pulses of opposite polarities and different amplitudes. For this purpose, use is made, on the side of the transmitting antenna 12, of a circuitry 14 as shown in FIG. 10. According to FIG. 10, circuitry 14 comprises a plurality of switch units 16, each of them including the same number of switch transistors 18. In this exemplary embodiment, each switch unit 16 comprises eight switch transistors 18. The switch transistors 18 have substantially the same switch-on resistance, which means that the values of the switch-on resistances deviate from each other by maximally 10%, preferably 5%.

As shown in FIG. 10, the switch transistors 18 schematically represented in the upper row form the weighted resistances, wherein the digit "1" adjacent to a switch transistor 18 indicates that the resistance is realized by merely one of the—in this embodiment—eight switch transistors 18. In the present exemplary embodiment, this resistance is 8R, i.e. eight times the resistance R. Thus, eight switch transistors 18 connected in parallel will result in a resistance of the amount R. Four switch transistors 18 connected in parallel will then result in a resistance of the amount 2R. Two switch transistors 18 connected in parallel will accordingly result in a resistance of the amount 4R. In FIG. 10, those switch transistors 18 per switch unit 16 which are not needed for realizing the respective weighted resistance are connected in the second row as dummy switch transistors 19 in parallel arrangement and toward mass.

Since, for each switch unit 16, a different number of switch transistors 18 are connected in parallel, the switch transistors 18 form weighted resistances. If, now, these weighted resistances are controlled in a temporal offset manner by drivers 20 which are triggered differently under the temporal aspect (see the function blocks 22,23 in FIG. 10), it is thereby achieved to generate the Gaussian transmit pulse of the 5th order.

Control of the drivers 20 is performed with the aid of timing generator 24 according to FIG. 12. This generator comprises a sequence of delay elements 26 with substantially identical delay time. The outputs Q0 to Q19 are connected to drivers and, via the latter, to switch units 16, as shown in FIG. 10. In this regard, it is to be noted that the circuitry 14 according to FIG. 10 will repeatedly generate a respective pair of Gaussian pulses of the 5th order which, per pair, are shifted in phase by 90°, as shown in FIG. 13 (see the waveforms 13' and 13" in FIG. 13). Further, timing generator 24 also serves for generating the identical Gaussian pulses of the 5th order in the receiving branch of the UWB device 10, which is shown in FIG. 11. The circuitry 14' according to FIG. 11 is ultimately identical to the circuitry 14 according to FIG. 10 so that, for correlation purposes as is the case of a UWB radar, there can be generated identical signals which are temporally exactly adjusted to each other. Accordingly, in FIG. 11, identical or functionally identical components and function blocks are provided with the same reference numerals as in FIG. 10, plus single prime symbol.

Further, the circuitry 14' of receiving antenna 12' comprises two Gilbert multipliers 28,30, each of them comprising a pair of transistors 32 and 34.

In FIGS. 12 and 13, the signal development at the outputs of timing generator 24 and at the outputs of the drivers 20,20' are shown. Together with the weighted resistances realized by the switch units 16, there is thus realized, both on the transmitter side and on the receiver side, a temporal sequence of respectively two Gaussian pulses of the 5th order shifted by 90°, as is shown in FIG. 1.

Main Aspects of the Invention

Generation of a waveform for ultra wide band radar.

For transmission, the waveform should comprise the required spectrum without there being performed an additional filtration.

The signal should be suited to be subjected to a large variety of derivative processes (transmission, reflection, reception) without losing its correlation properties. In practical use, the case may occur that the waveform undergoes up to five derivative processes before reaching the receiver. For this reason, it is preferred to use a Gaussian pulses of the 5th order. This function does not suffer any significant deformation when it is transmitted (first time derivation), reflected (second time derivation) and received (third time derivation).

Power consumption of the transmitter is as low as possible.

The characteristic form of the transmit signal is not generated from a voltage rise time. According to the present invention, the form is generated by means of weighted switches controlled by partially overlapping signals which result directly in the required waveform.

Advantages of the Invention

Operation with low energy requirement
Robust concept
Simple implementation
Low complexity
Merely very small chip area required
No complex filters required
No LNA (low noise amplifier) required
No GHz oscillator because the transmit pulse is generated digitally

The invention claimed is:

1. A method for operating a UWB device having at least one transmitting antenna and/or at least one receiving antenna, said method comprising the following steps:

controlling the transmitting antenna or the receiving antenna with a control pulse signal having a sequence of substantially sinusoidal pulses of alternating polarity and differing amplitudes, alternately supplying the transmitting antenna with current pulses of differing polarity and differing magnitude by switching on and off first electronic switch units that are coupled to the transmitting antenna and have resistances associated with the amplitudes of pulses to be generated, wherein each first switch unit has a specifiable number of first switching transistors, each having substantially identical on-state resistance values (R), adjusting the resistance of a first switch unit either by using only one of the first switching transistors or by using a plurality of first switching transistors which are connected in parallel, and sequentially controlling the first switch units according to a specifiable temporal schema and each with predetermined length for a control time interval; and wherein the pulse signal comprises two substantially identical sequences, phase-shifted by 90°, of substantially identical sinusoidal pulses.

2. The method according to claim 1, wherein the control time intervals of the first switch units being controlled temporally sequentially are mutually overlapping or are temporally spaced.

3. The method according to claim 1, wherein the receiving antenna is coupled to a second Gilbert multiplier, one of the two Gilbert multipliers being supplied with a pulse signal substantially identical with the control pulse signal for the transmitting antenna and the other one of the two Gilbert multipliers being supplied with a pulse signal shifted in phase by 90° relative to said pulse signal.

4. The method according to claim 1, wherein the control pulse signal has the waveform of a fifth-order Gaussian pulse signal.

5. The method according to claim 1, wherein the specifiable numbers of first switching transistors are equal.

6. A method for operating a UWB device having at least one transmitting antenna and/or at least one receiving antenna, said method comprising the following steps:

controlling the transmitting antenna or the receiving antenna with a control pulse signal having a sequence of substantially sinusoidal pulses of alternating polarity and differing amplitudes, alternately supplying the transmitting antenna with current pulses of differing polarity and differing magnitude by switching on and off first electronic switch units that are coupled to the transmitting antenna and have resistances associated with the amplitudes of pulses to be generated, wherein each first switch unit has a specifiable number of first switching transistors, each having substantially identical on-state resistance values (R), adjusting the resistance of a first switch unit either by using only one of the first switching transistors or by using a plurality of first switching transistors which are connected in parallel, and sequentially controlling the first switch units according to a specifiable temporal schema and each with predetermined length for a control time interval; and wherein, for correlation of a receive signal received by the receiving antenna with a transmit signal, a correlation signal is generated by use of second switch units similar to the first switch units, said second switch units being sequentially controlled according to the temporal schema in the same manner as the first switch units.

7. The method of claim 6, wherein the correlation signal is generated in the same manner as the transmit signal.

8. A method for operating a UWB device having at least one transmitting antenna and/or at least one receiving antenna, said method comprising the following steps:
controlling the transmitting antenna or the receiving antenna with a control pulse signal having a sequence of substantially sinusoidal pulses of alternating polarity and differing amplitudes,
alternately supplying the transmitting antenna with current pulses of differing polarity and differing magnitude by switching on and off first electronic switch units that are coupled to the transmitting antenna and have resistances associated with the amplitudes of pulses to be generated, wherein each first switch unit has a specifiable number of first switching transistors, each having substantially identical on-state resistance values (R),
adjusting the resistance of a first switch unit either by using only one of the first switching transistors or by using a plurality of first switching transistors which are connected in parallel, and
sequentially controlling the first switch units according to a specifiable temporal schema and each with predetermined length for a control time interval; and
wherein the receiving antenna is connected with at least one Gilbert multiplier comprising a respective differential stage consisting of a pair of transistors, wherein the differential stage of the Gilbert multiplier has second switch units connected to it which can be switched on and off and via which a pulse signal is supplied to the Gilbert multiplier that is substantially similar to the control signal for the transmitting antenna, wherein each second switch unit comprises a specifiable number of second switch transistors each having substantially the same resistance value (R), wherein the resistance of a second switch unit is set either by use of only one of the second switch transistors or by use of a plurality of second switch transistors which are connected in parallel, and wherein the second switch units are controlled according to substantially the same temporal schema as the first switch units in a sequential manner and with predetermined length for the control time interval.

9. The method according to claim 8, wherein the receiving antenna is coupled to a second Gilbert multiplier, said one Gilbert multiplier being supplied with a pulse signal substantially identical with the control pulse signal for the transmitting antenna and the second Gilbert multipliers being supplied with a pulse signal shifted in phase by 90° relative to said pulse signal.

10. The method of claim 8, wherein the specifiable numbers of second switch transistors are identical.

11. A method for operating a UWB device having at least one transmitting antenna and/or at least one receiving antenna, said method comprising the following steps:
controlling the transmitting antenna or the receiving antenna with a control pulse signal having a sequence of substantially sinusoidal pulses of alternating polarity and differing amplitudes,
alternately supplying the transmitting antenna with current pulses of differing polarity and differing magnitude by switching on and off first electronic switch units that are coupled to the transmitting antenna and have resistances associated with the amplitudes of pulses to be generated, wherein each first switch unit has a specifiable number of first switching transistors, each having substantially identical on-state resistance values (R),
adjusting the resistance of a first switch unit either by using only one of the first switching transistors or by using a plurality of first switching transistors which are connected in parallel, and
sequentially controlling the first switch units according to a specifiable temporal schema and each with predetermined length for a control time interval; and
wherein all switch transistors have a respective switch-on resistance value, the deviation of the switch-on resistance values from a specifiable reference value being maximally 10%.

12. The method of claim 11, wherein the deviation of the switch-on resistance values from a specifiable reference value is maximally 5%.

* * * * *